(12) United States Patent
Li et al.

(10) Patent No.: US 9,608,218 B2
(45) Date of Patent: Mar. 28, 2017

(54) N-TYPE THIN FILM TRANSISTOR

(71) Applicants: Tsinghua University, Beijing (CN); HON HAI PRECISION INDUSTRY CO., LTD., New Taipei (TW)

(72) Inventors: Guan-Hong Li, Beijing (CN); Qun-Qing Li, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/985,252

(22) Filed: Dec. 30, 2015

(65) Prior Publication Data

US 2016/0190493 A1 Jun. 30, 2016

(30) Foreign Application Priority Data

Dec. 31, 2014 (CN) .......................... 2014 1 0848449

(51) Int. Cl.
*H01L 51/05* (2006.01)
*H01L 51/00* (2006.01)

(52) U.S. Cl.
CPC ...... *H01L 51/0541* (2013.01); *H01L 51/0048* (2013.01); *H01L 51/0096* (2013.01); *H01L 51/0525* (2013.01); *H01L 51/0529* (2013.01); *H01L 51/0558* (2013.01)

(58) Field of Classification Search
CPC ............. H01L 51/0541; H01L 51/0048; H01L 51/0096; H01L 51/0525; H01L 51/0529; H01L 51/0558
See application file for complete search history.

(56) References Cited

U.S. PATENT DOCUMENTS

| 5,208,476 | A | * | 5/1993 | Inoue | ................ H01L 29/78621 257/408 |
| 5,736,751 | A | * | 4/1998 | Mano | ..................... G02F 1/1368 257/347 |
| 7,800,139 | B2 | | 9/2010 | Lee et al. | |
| 8,435,832 | B2 | * | 5/2013 | Shieh | ................ H01L 29/66969 257/E21.461 |

(Continued)

FOREIGN PATENT DOCUMENTS

TW 201246309 11/2012
TW 201306137 2/2013

*Primary Examiner* — Ida M Soward
(74) *Attorney, Agent, or Firm* — Zhigang Ma

(57) ABSTRACT

An N-type thin film transistor includes an insulating substrate, a semiconductor carbon nanotube layer, an MgO layer, a functional dielectric layer, a source electrode, a drain electrode, and a gate electrode. The semiconductor carbon nanotube layer is located on the insulating substrate. The source electrode and the drain electrode electrically connect the semiconductor carbon nanotube layer, wherein the source electrode and the drain electrode are spaced from each other, and a channel is defined in the semiconductor carbon nanotube layer between the source electrode and the drain electrode. The MgO layer is located on the semiconductor carbon nanotube layer. The functional dielectric layer covers the MgO layer. The gate electrode is located on the functional dielectric layer.

14 Claims, 10 Drawing Sheets

(56) References Cited

U.S. PATENT DOCUMENTS

| | | | |
|---|---|---|---|
| 8,642,410 B2* | 2/2014 | Hayashi | B82Y 10/00 257/E51.038 |
| 8,815,683 B2* | 8/2014 | Kim | B82Y 10/00 257/24 |
| 8,841,650 B2* | 9/2014 | Raza | B82Y 10/00 257/24 |
| 9,171,942 B2 | 10/2015 | Mochizuki et al. | |
| 2006/0006377 A1 | 1/2006 | Golovchenko et al. | |
| 2008/0014675 A1* | 1/2008 | Kameyama | B82Y 10/00 438/82 |
| 2008/0017849 A1 | 1/2008 | Yukawa et al. | |
| 2009/0200912 A1 | 8/2009 | Ren et al. | |
| 2009/0246408 A1 | 10/2009 | Chan et al. | |
| 2011/0068324 A1* | 3/2011 | Matsumoto | B82Y 10/00 257/24 |
| 2012/0280213 A1* | 11/2012 | Gau | H01L 51/0048 257/29 |
| 2012/0302003 A1 | 11/2012 | Shieh et al. | |

* cited by examiner

N-TYPE THIN FILM TRANSISTOR

This application claims all benefits accruing under 35 U.S.C. §119 from China Patent Application No. 201410848449.3, filed on Dec. 31, 2014 in the China Intellectual Property Office, the contents of which are hereby incorporated by reference.

BACKGROUND

1. Technical Field

The present invention relates to an N-type thin film transistor.

2. Description of Related Art

Carbon nanotubes, because of its excellent electrical, optical and mechanical properties, has become a strong contender for next-generation semiconductor materials, has been widely used in the preparation and study of thin film transistor (TFT). Scientific research shows that the carbon nanotubes are configured as an intrinsic semiconductor. However, under normal circumstances, such as air, the carbon nanotubes behave as P-type semiconductor characteristics. Thus it is easy to prepare P-type thin film transistors with carbon nanotubes. But the integrated circuits with merely the P-type thin film transistor will greatly reduce the associated performance of the integrated circuits, and increase loss.

The method of making N-type thin film transistor with carbon nanotubes comprises chemical doping, selecting low-work function metal deposition as electrode. However, there are some problems in these methods. The chemical doping methods can not maintain long-term and stable of the device performance. In addition, there is a potential drawback dopant diffusion of pollution. In the thin film transistor adopting low function metal as electrode, the N-type unipolar characteristic is not obvious.

What is needed, therefore, is an N-type TFT that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
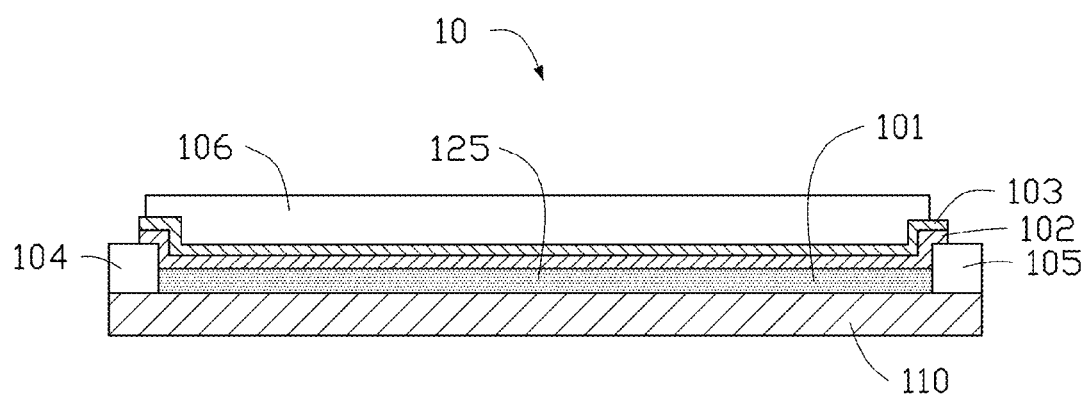
FIG. 1 shows a cross-section view of one embodiment of an N-type TFT.

Referring to FIG. 1, one embodiment of an N-type thin film transistor (TFT) 10 comprises an insulating substrate 110, a semiconductor carbon nanotube layer 101, a source electrode 104, a drain electrode 105, an MgO layer 102, a functional dielectric layer 103, and a gate electrode 106. The semiconductor carbon nanotube layer 101 is on the insulating substrate 110. The source electrode 104 and the drain electrode 105 are spaced from each other, and electrically connected to the semiconductor carbon nanotube layer 101. A channel 125 is defined in the semiconductor carbon nanotube layer 101 between the source electrode 104 and the drain electrode 105. The MgO layer 102 is sandwiched between the functional dielectric layer 103 and the semiconductor carbon nanotube layer 101. The gate electrode 106 is located on the functional dielectric layer 103, and insulated from the semiconductor carbon nanotube layer 101, the source electrode 104, and the drain electrode 105. The N-type TFT 10 is a top-gate type TFT.

A material of the insulating substrate 110 can be hard material or flexible material. The hard material can be as glass, quartz, ceramics, or diamond. The flexible material can be plastics or resins. The flexible material can also be polyethylene terephthalate, polyethylene naphthalate, polyethylene terephthalate, or polyimide. In one embodiment, the material of the insulating substrate 110 is polyethylene terephthalate. The insulating substrate 110 is used to support the different elements on the insulating substrate 110.

The semiconductor carbon nanotube layer 101 is located on the insulating substrate 110. The semiconductor carbon nanotube layer 101 comprises a plurality of carbon nanotubes. The semiconductor carbon nanotube layer 101 has semi-conductive property. The semiconductor carbon nanotube layer 101 can consist of a plurality of semi-conductive carbon nanotubes. In one embodiment, a few metallic carbon nanotubes can be existed in the semiconductor carbon nanotube layer 101, but the metallic carbon nanotubes cannot affect the semi-conductive property of the semiconductor carbon nanotube layer 101.

The plurality of carbon nanotubes are connected with each other to form a conductive network. The carbon nanotubes of the semiconductor carbon nanotube layer 101 can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the semiconductor carbon nanotube layer 101 are arranged to extend along the direction substantially parallel to the surface of the carbon nanotube layer. In one embodiment, all the carbon nanotubes in the semiconductor carbon nanotube layer 101 are arranged to extend along the same direction. In another embodiment, some of the carbon nanotubes in the carbon nanotube layer are arranged to extend along a first direction, and some of the carbon nanotubes in the semiconductor carbon nanotube layer 101 are arranged to extend along a second direction, perpendicular to the first direction.

In one embodiment, the semiconductor carbon nanotube layer 101 is a free-standing structure and can be drawn from a carbon nanotube array. The term "free-standing structure" means that the semiconductor carbon nanotube layer 101 can sustain the weight of itself when it is hoisted by a portion thereof without any significant damage to its structural integrity. Thus, the semiconductor carbon nanotube layer 101 can be suspended by two spaced supports. The free-standing semiconductor carbon nanotube layer 101 can be laid on the insulating layer 104 directly and easily. In one embodiment, the semiconductor carbon nanotube layer 101 can be formed on a surface of insulated support (not shown).

The semiconductor carbon nanotube layer 101 can be a substantially pure structure of the carbon nanotubes, with few impurities and chemical functional groups. The semiconductor carbon nanotube layer 101 can also be composed of a combination of semi-conductive and metallic carbon nanotubes obtained via chemical vapor deposition. The ratio between semi-conductive and metallic of carbon nanotubes is 2:1, and the percentage of the semi-conductive carbon nanotubes is about 66.7% in the combination. In one embodiment, all of the metallic carbon nanotubes can be completely removed via chemical separation method. In another embodiment, most of the metallic carbon nanotubes are removed, and there are a few metallic carbon nanotubes left. Furthermore, the percentage of the semi-conductive carbon nanotubes in the semiconductor carbon nanotube layer 101 ranges from about 90% to about 100%. The semiconductor carbon nanotube layer 101 has good semi-conductive property. In one embodiment, the semiconductor carbon nanotube layer 101 consists of a plurality of single-walled carbon nanotubes. The plurality of single-walled carbon nanotubes are parallel with each other. A diameter of the carbon nanotube is smaller than 2 nanometers. A thickness of the semiconductor carbon nanotube layer 101 ranges from about 0.5 nanometers to about 2 nanometers. A length of the carbon nanotube ranges from about 2 micrometers to about 4 micrometers. In one embodiment, a diameter of the carbon nanotube is greater than 0.9 nanometers and smaller than 1.4 nanometers.

Figure 2:
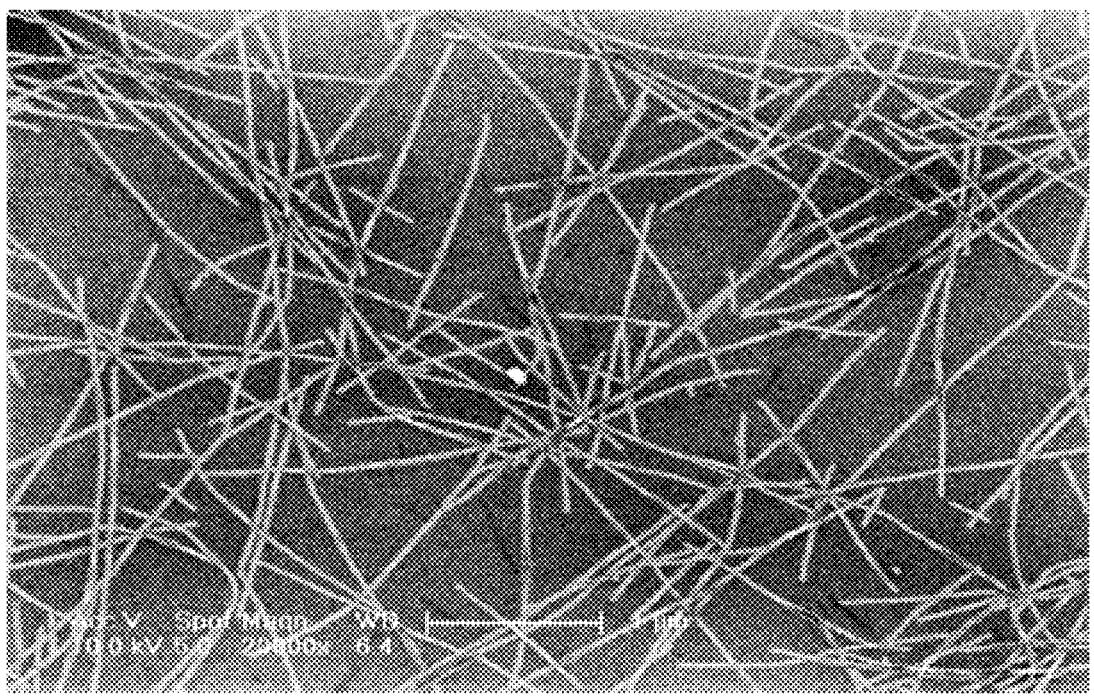
FIG. 2 shows a scanning electron microscope (SEM) view of a semiconductor carbon nanotube film.

Referring to FIG. 2, in one embodiment, the semiconductor carbon nanotube layer 101 consists of the single-walled carbon nanotubes, and the percentage of the semi-conductive carbon nanotubes in the semiconductor carbon nanotube layer 101 is about 98%. The plurality of single-walled carbon nanotubes are entangled with each other to form the conductive network. The diameter of the single-walled carbon nanotube is about 1.2 nanometers. The thickness of the semiconductor carbon nanotube layer 101 is about 1.2 nanometers.

The MgO layer 102 can entirely cover the surface of the semiconductor carbon nanotube layer 101. The MgO layer 102 is in direct contact with the semiconductor carbon nanotube layer 101. The MgO layer 102 is configured to modulate the semiconductor carbon nanotube layer 101, reduce holes, and improve electrons in the semiconductor carbon nanotube layer 101. A thickness of the MgO layer 102 can range from about 1 nanometer to about 15 nanometers. In one embodiment, the thickness of the MgO layer 102 ranges from about 1 nanometers to about 10 nanometers. If the thickness of the MgO layer 102 is smaller than 1 nanometer, the MgO layer 102 cannot effectively isolated the air and water molecular from the semiconductor carbon nanotube layer 101, and the structure of TFT cannot sustain the stability; if the thickness of the MgO layer 102 is greater than 15 nanometers, the holes in the semiconductor carbon nanotube layer 101 cannot be effectively reduced, and the modulation efficiency of TFT will be dramatically reduced. In one embodiment, the thickness of the MgO layer 102 is about 1 nanometer.

The MgO layer 102 is located on the semiconductor carbon nanotube layer 101. Furthermore, the semiconductor carbon nanotube layer 101 is sandwiched between the MgO layer 102 and the insulating substrate 110. The semiconductor carbon nanotube layer 101 comprises a first surface and a second surface opposite to the first surface. The second surface is attached to the insulating substrate 110. At least 80% of the first surface is covered by the MgO layer 102. Furthermore, entire the first surface can be covered by the MgO layer 102. Furthermore, the semiconductor carbon nanotube layer 101 is sealed by the MgO layer 102 and the insulating substrate 110. Thus the semiconductor carbon nanotube layer 101 can be completely isolated from air and moisture.

The functional dielectric layer 103 is located on the MgO layer 102. In one embodiment, the functional dielectric layer 103 covers entire the MgO layer 102. The term "functional dielectric layer" includes, but not limited to, that the functional dielectric layer 103 can dope the semiconductor carbon nanotube layer 101 under the affect of the MgO layer 102. Furthermore, the functional dielectric layer 103 is insulating and can isolate the semiconductor carbon nanotube layer 101 from oxygen and water molecular. Thus the semiconductor carbon nanotube layer 101 has N-type property. A material of the functional dielectric layer 103 can be aluminum oxide, hafnium oxide, or yttrium oxide.

In detail, the functional dielectric layer 103 covers the MgO layer 102, and insulates the gate electrode 106 from the semiconductor carbon nanotube layer 101, the source electrode 104, and the drain electrode 105. In addition, the functional dielectric layer 103 has high density, thus the functional dielectric layer 103 can isolate the air and the water molecular. Furthermore, the functional dielectric layer 103 lacks positive charges, thus the semiconductor carbon nanotube layer 101 can be doped with electrons, and the semiconductor carbon nanotube layer 101 has N-type property. A thickness of the functional dielectric layer 103 can range from about 20 nanometers to about 40 nanometers. In one embodiment, the thickness of the functional dielectric layer 103 ranges from about 25 nanometers to about 30 nanometers. While the thickness of the functional dielectric layer 103 is too small, such as smaller than 20 nanometer, the functional dielectric layer 103 cannot isolate the air and water molecular. While the thickness is greater than 40 nanometers, the gate electrode 106 cannot modulate the semiconductor carbon nanotube layer 101. In one embodiment, the material of the functional dielectric layer 103 is aluminum oxide, and the thickness is about 30 nanometers.

The gate electrode 106 is formed on the functional dielectric layer 103 and insulated from the channel 125 formed in the semiconductor carbon nanotube layer 101. Furthermore, the length of the gate electrode 106 can smaller than the length of the channel between the source electrode 104 and the drain electrode 105.

The material of the gate electrode 106 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the gate electrode 106 can comprises Au and Ti. The thickness of the Ti is about 2 nanometers, and the thickness of the Au is about 50 nanometers.

The material of the source electrode 104 and the drain electrode 105 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the source electrode 104 and the drain electrode 105 can comprises Au and Ti. The thickness of the Ti is about 2 nanometers, and the thickness of the Au is about 50 nanometers. In one embodiment, the source electrode 104 and the drain electrode 105 are located on opposite edges of the insulating substrate 110, and electrically connected to the semiconductor carbon nanotube layer 101. Thus the channel 125 is defined between the source electrode 104 and the drain electrode 105.

In use, the source electrode is grounded. A voltage $V_d$ is applied to the drain electrode. Another voltage $V_g$ is applied on the gate electrode. The voltage $V_g$ forming an electric field in the channel of semiconductor carbon nanotube layer. Accordingly, carriers exist in the channel near the gate electrode. As the $V_g$ increasing, a current is generated and flows through the channel. Thus, the source electrode and the drain electrode are electrically connected.

Figure 3:
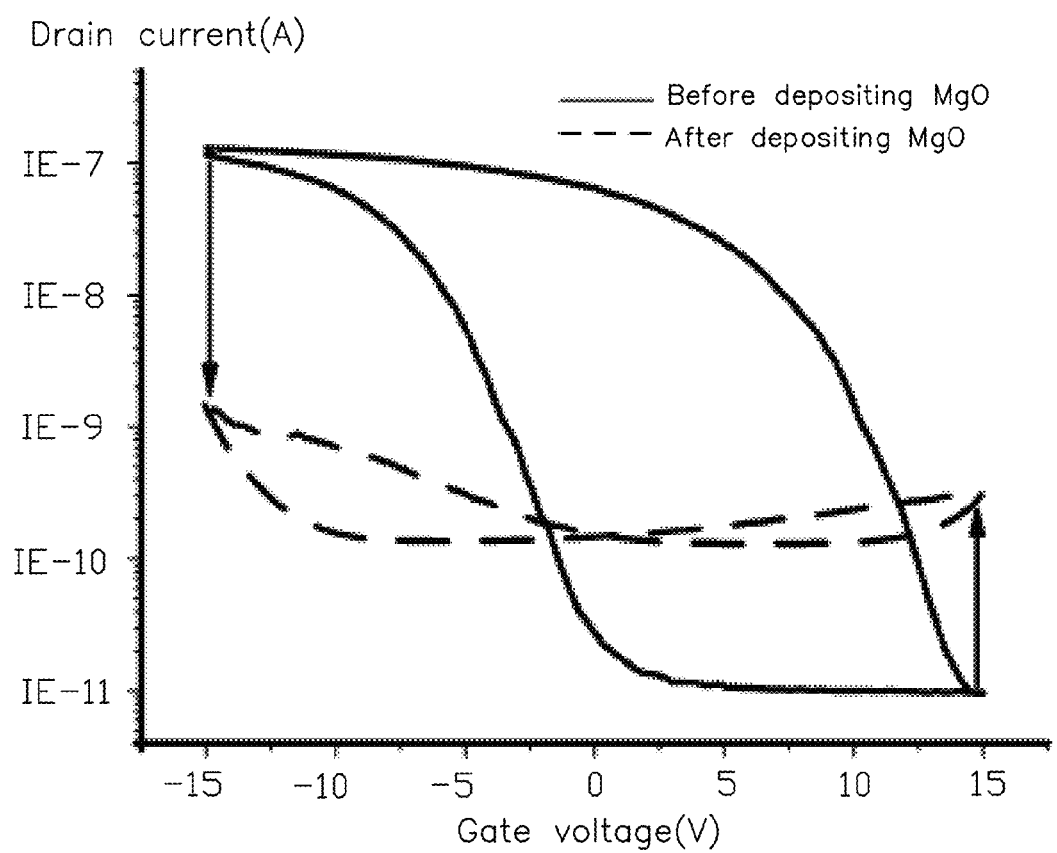
FIG. 3 shows a schematic view of an I-V graph of TFT before and after depositing with MgO.

Referring to FIG. 3, an I-V graph of a TFT before and after depositing the MgO layer is provided. The P-type property is reduced, and N-type property is improved after depositing MgO.

Figure 4:
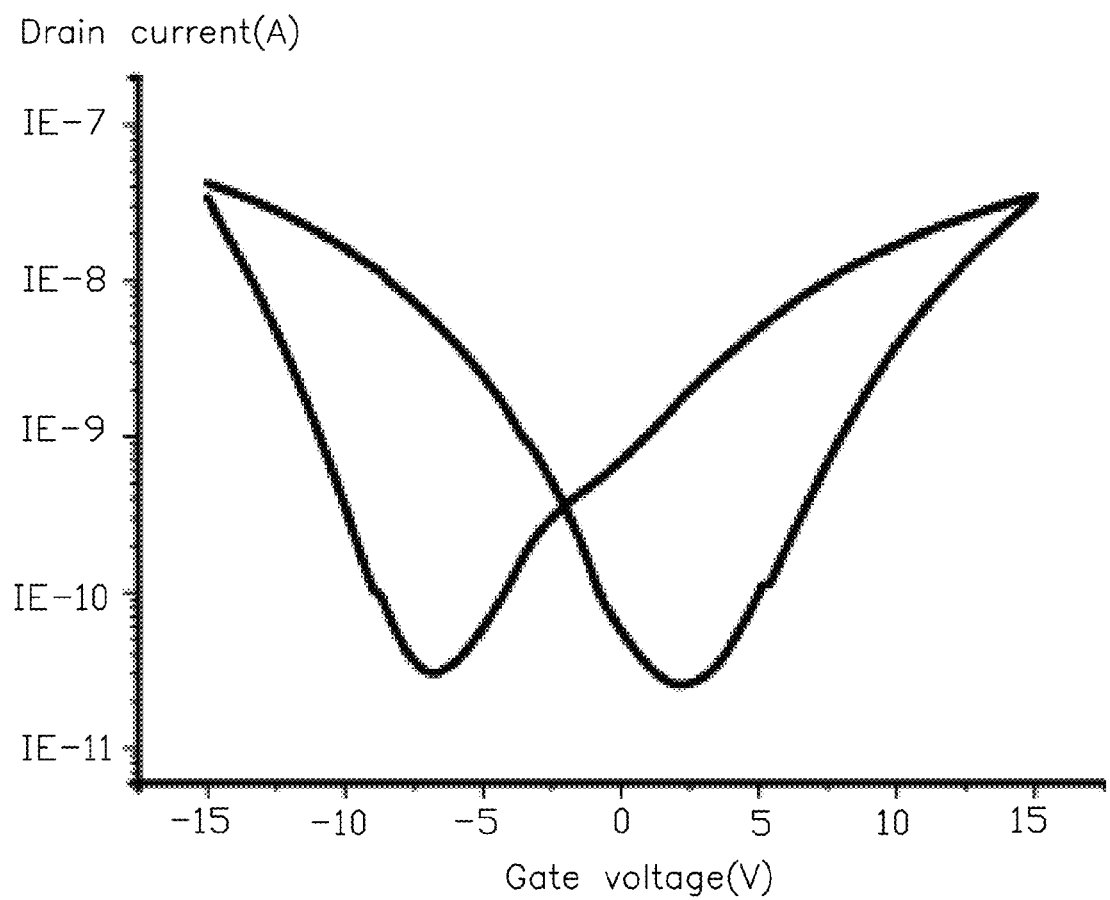
FIG. 4 shows a schematic view of an I-V graph of TFT deposited with a second dielectric layer.

Referring to FIG. 4, an I-V graph of a TFT of depositing the functional dielectric layer 103 but without the first dielectric layer 112 is provided. The N-type property is improved, but the P-type property is not changed. Thus the TFT has bipolar property.

Figure 5:
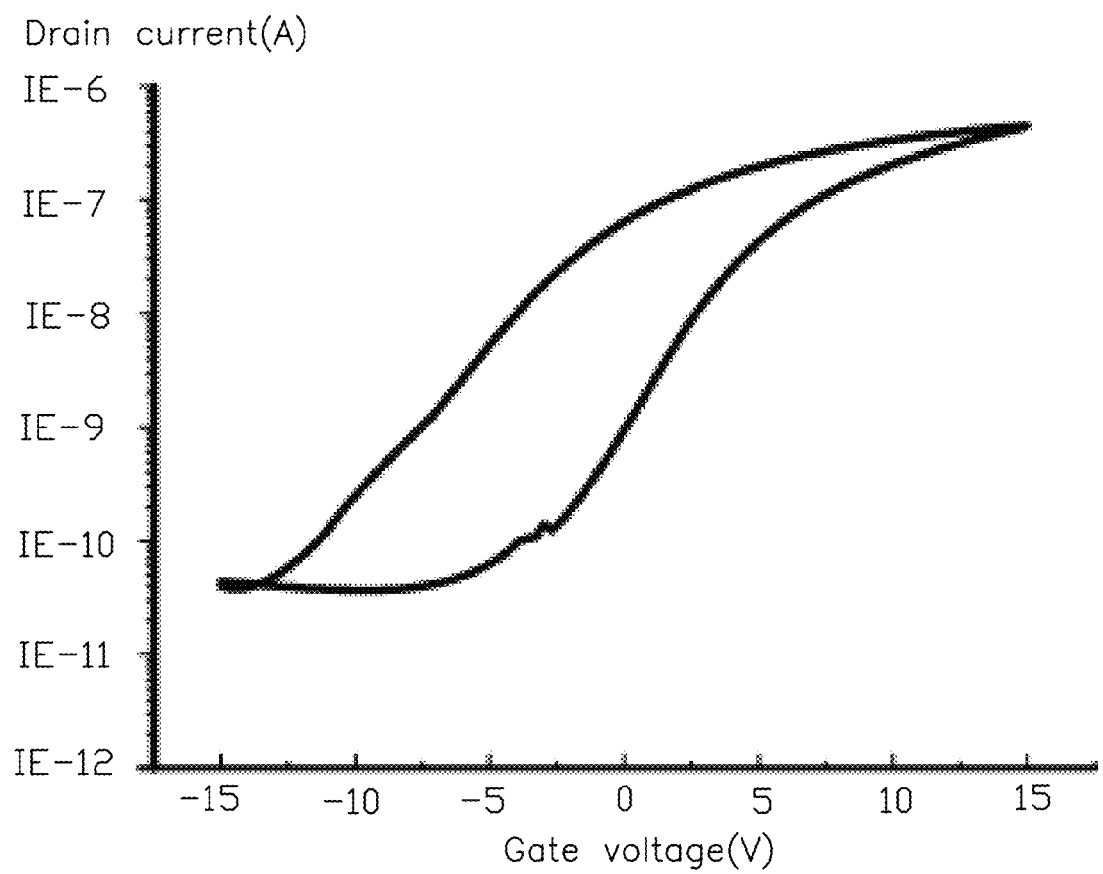
FIG. 5 shows a schematic view of an I-V graph of one embodiment of TFT.

Referring to FIG. 5, an I-V graph of the TFT of one embodiment with the MgO layer and the functional dielectric layer shows that the TFT has great N-type property.

The N-type TFT has following advantages. The surface of the semiconductor carbon nanotube layer is coated with the MgO layer and the functional dielectric layer, the function dielectric layer has high density and lack of positive charges, thus the function dielectric layer can provide electrons for the semiconductor carbon nanotube layer. Then the TFT has great N-type property. Furthermore, the MgO layer can isolate the air and water molecular, and absorbs the water molecular in the semiconductor carbon nanotube layer to reduce the N-type property. Therefore, the TFT has great stability. Thus the lifespan of the TFT is prolonged.

Figure 6:
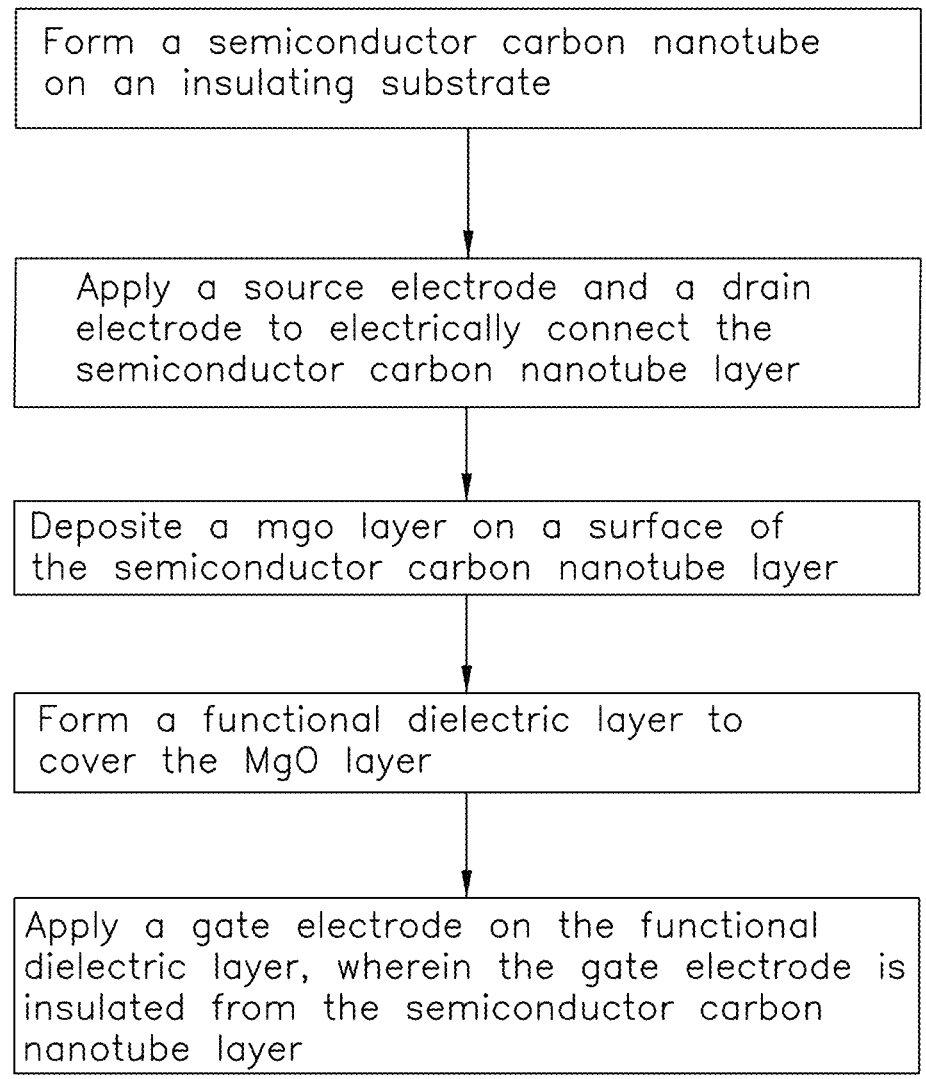
FIG. 6 is a flow chart of one embodiment of a method of making N-type TFT.

Referring to FIG. 6, one embodiment of a method of making an N-type thin film transistor (TFT) 10 comprises:
step (S11), forming a semiconductor carbon nanotube 101 on an insulating substrate 110;
step (S12), applying a source electrode 104 and a drain electrode 105 to be electrically connected to the semiconductor carbon nanotube layer 101;
step (S13), depositing a MgO layer 102 on a surface of the semiconductor carbon nanotube layer 101;
step (S14), forming a functional dielectric layer 103 to cover the MgO layer 102; and
step (S15), applying a gate electrode 106 on the functional dielectric layer, wherein the gate electrode 106 is insulated from the semiconductor carbon nanotube layer 101.

In step (S11), the semiconductor carbon nanotube layer 101 can be formed on the insulating substrate 110 by:
step (S111), providing a plurality of semiconductor carbon nanotube particles;
step (S112), obtaining a carbon nanotube suspension by mixing the plurality of semiconductor carbon nanotube particles with a solvent; and
step (S113), forming the semiconductor carbon nanotube layer 101 by applying the carbon nanotube suspension on the insulating substrate 110.

In step (S111), the plurality of semiconductor carbon nanotube particles can be mixed single-walled carbon nanotubes obtained through arc discharge method. Furthermore, the metallic carbon nanotubes can be removed from the mixed single-walled carbon nanotubes to obtain pure semiconductor single-walled carbon nanotubes. In one embodiment, the percentage of the semiconductor single-walled carbon nanotubes in the plurality of semiconductor carbon nanotube particles is greater than 66.7%. In another embodiment, the percentage of the semi-conductive carbon nanotubes in the plurality of semiconductor carbon nanotube particles is about 98%.

In step (S112), the carbon nanotube suspension can be obtained through stirring method or ultrasonic dispersion method. The plurality of semiconductor carbon nanotube particles are uniformly dispersed in the carbon nanotube suspension. The plurality of semiconductor carbon nanotube particles are dispersed into the solvent and ultrasonicated. The ultrasonic time can range from about 30 minutes to about 3 hours. The ultrasonic power can range from about 300 W to about 600 W. The solvent can be water, ethanol, N-methylpyrrolidone (NMP), acetone, chloroform, or tetrahydrofuran, etc. The solvent has polar groups such hydroxy group or carboxyl group, thus the solvent exhibits a strong polarity, and has a large dielectric constant. The plurality of semiconductor carbon nanotube particles can form the conductive network after mixing process. In one embodiment, the semiconductor carbon nanotube particles are uniformly dispersed in NMP via ultrasonic method. A ratio between a weight of the plurality of semiconductor carbon nanotube particles and volume of the NMP is about 1 mg: 30 ml.

In step (S113), the plurality of carbon nanotubes can be deposited on the insulating substrate 110 by:
locating the insulating substrate 110 at a bottom of container;
pouring the carbon nanotube suspension into the container; and
depositing the plurality of carbon nanotubes onto the insulating substrate 110 after standing for a certain time.

The plurality of carbon nanotubes will be deposited on the insulating substrate 110 under weight force and attractive force. Furthermore, while the semiconductor carbon nanotube layer 101 is a free-standing structure, the semiconductor carbon nanotube layer 101 can be directly laid on the insulating substrate 110. Furthermore, the semiconductor layer 120 can comprise a plurality of wires or a carbon nanotube film. The carbon nanotube film comprises a plurality of carbon nanotubes joined end to end by van der Waals force. The carbon nanotube wire can be obtained by treating the carbon nanotube film with an organic solution. The carbon nanotube film will be shrunk into the carbon nanotube wire.

In one embodiment, the insulating substrate 110 can be pretreated to form a polar surface. The polar surface of the insulating substrate 110 can be formed by treating a surface of the insulating substrate 110 before forming the semiconductor carbon nanotube layer 101. The polar groups can attracts the plurality of carbon nanotubes in the semiconductor carbon nanotube layer 101.

In one embodiment, the insulating substrate 110 is treated by:

step (S11'), hydrophilic treating the insulating substrate 110 via ion etching; and step (S12'), functionalizing the insulating substrate 110 with an organic solution, wherein the surface of the insulating substrate 110 comprises the plurality of polar groups.

In step (S12'), the organic solution can be aminopropyl triethoxysilane (APTES) solution, or polylysine (poly-L-lysine) solution. Furthermore, other solution with polar group can be applied. In one embodiment, the organic solution is APTES. The insulating substrate 110 can be firmly adjoined to the APTES. The amino group in the APTES can be firmly adjoined to the MgO layer 102. Thus the MgO layer 102 can be quickly and firmly attached on the insulating substrate 110. Furthermore, the particles in the first dielectric layer 112 can also be tightly attached on the insulating substrate 110. Thus the stability of the N-type TFT 10 can be improved.

In step (S12), the source electrode 104 and the drain electrode 105 can be formed via evaporating, sputtering, or printing. In one embodiment, the source electrode 104 is formed on the semiconductor carbon nanotube layer 101 via evaporating. The material of the source electrode 104 and the drain electrode 105 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the source electrode 104 and the drain electrode 105 can comprises Au and Ti. The thickness of the Ti is about 2 nanometers, and the thickness of the Au is about 50 nanometers. In one embodiment, the source electrode 104 and the drain electrode 105 are located on opposite edges of the insulating substrate 110, and electrically connected to the semiconductor carbon nanotube layer 101. Thus a channel 125 is defined between the source electrode 104 and the drain electrode 105.

In step (S13), the MgO layer 102 can be deposited on the semiconductor carbon nanotube layer 101 via magnetron sputtering method, evaporation method, or electron beam deposition method. The MgO layer 102 can entirely cover the surface of the semiconductor carbon nanotube layer 101. The MgO layer 102 can be continuously deposited on the semiconductor carbon nanotube layer 101 during deposition, ensuring that the semiconductor carbon nanotube layer 101 is completely isolated from air. Thus the carbon nanotubes in the semiconductor carbon nanotube layer 101 are isolated from air.

In step (S14), the functional dielectric layer 103 is deposited on the MgO layer 102. In one embodiment, the functional dielectric layer 103 covers entire the MgO layer 102. In detail, the functional dielectric layer 103 covers the MgO layer 102, and insulates the gate electrode 106 from the semiconductor carbon nanotube layer 101. The functional dielectric layer 103 can be formed on the MgO layer 102 via atomic layer deposition (ALD) in a temperature of about 120° C. Thus the functional dielectric layer 103 can have high density and lacks positive charges. Then the functional dielectric layer 103 can isolate the air and water, and dopes the semiconductor carbon nanotube layer 101. In one embodiment, the source gas is trimethylaluminum and water vapor, and the carrier gas is nitrogen.

In step (S15), the gate electrode 106 is formed on the functional dielectric layer 103 and insulated from the channel 125 formed in the semiconductor carbon nanotube layer 101. Furthermore, the length of the gate electrode 106 can smaller than the length of the channel between the source electrode 104 and the drain electrode 105.

The gate electrode 106 can be formed via evaporating, sputtering, or printing. In one embodiment, the gate electrode 106 is formed on the functional dielectric layer 103 via evaporating a composite layer comprising Au and Ti. The material of the gate electrode 106 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In one embodiment, the material of the gate electrode 106 can comprises Au and Ti. The thickness of the Ti is about 2 nanometers, and the thickness of the Au is about 50 nanometers.

Figure 7:
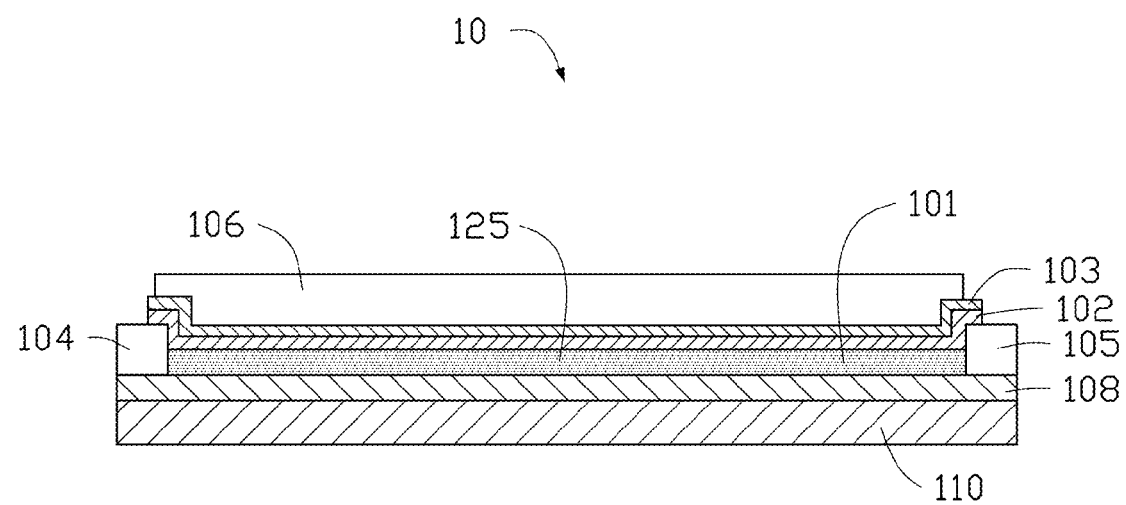
FIG. 7 shows a cross-section view of one embodiment of an N-type TFT.

Furthermore, referring to FIG. 7, another MgO layer 108 can be formed on the insulating substrate 110 before forming the semiconductor carbon nanotube layer 101. The MgO layer 108 is sandwiched between the semiconductor carbon nanotube layer 101 and the insulating substrate 110. The MgO layer 108 is in direct contact with the semiconductor carbon nanotube layer 101. Thus both two opposite surfaces of the semiconductor carbon nanotube layer 101 is coated with the MgO layers 101, 108. Furthermore, the semiconductor carbon nanotube layer 101 is sealed by the two MgO layers s 101, 108, and the MgO layers 101, 108 completely surround the semiconductor carbon nanotube layer 101.

The method of making N-type TFT has following advantages. The semiconductor carbon nanotube layer is coated with the MgO layer and the functional dielectric layer, and the TFT has N-type property. The method has no pollution, and the TFT has great stability. Thus the lifespan of the TFT is prolonged. The method of making N-type TFT can be compatible with the traditional semiconductor process. Furthermore, the method of making N-type TFT can successfully transfer the P-type CNT device into N-type CNT TFT, and then the CMOS can be easily achieved by combining the P-type CNT device and N-type CNT device. Therefore, the integration can be improved, the performance can be enhanced, and the loss can be reduced.

Figure 8:
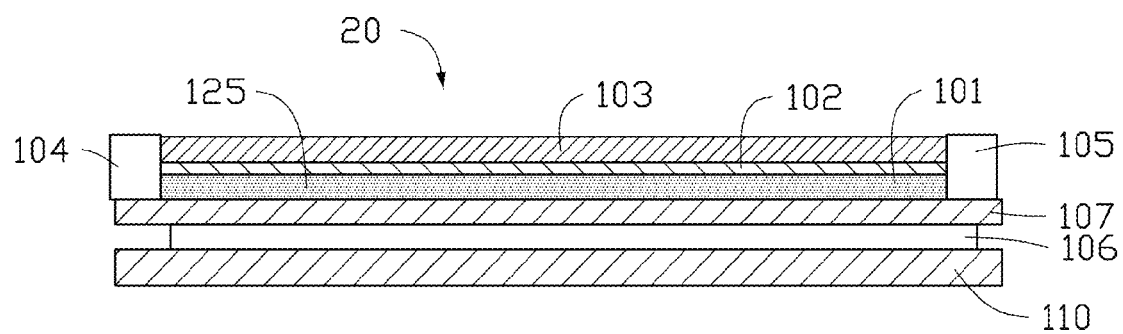
FIG. 8 shows a cross-section view of one embodiment of an N-type TFT.

Referring to FIG. 8, one embodiment of an N-type TFT 20 comprises an insulating substrate 110, a gate electrode 106, a insulating layer 107, a semiconductor carbon nanotube layer 101, an MgO layer 102, a functional dielectric layer 103, a source electrode 104, and a drain electrode 105. The gate electrode 106 is located on the insulating substrate 110. The insulating layer 107 covers the gate electrode 106. The semiconductor carbon nanotube layer 101 is located on the insulating layer 107 and insulated from the gate electrode 106.

The structure of the N-type TFT 20 is similar to the N-type TFT 10, except that the N-type TFT 20 further comprises the insulating layer 107, and the gate electrode 106 is on the insulating substrate 110. The N-type TFT 20 is bottom-gate type TFT.

Figure 9:
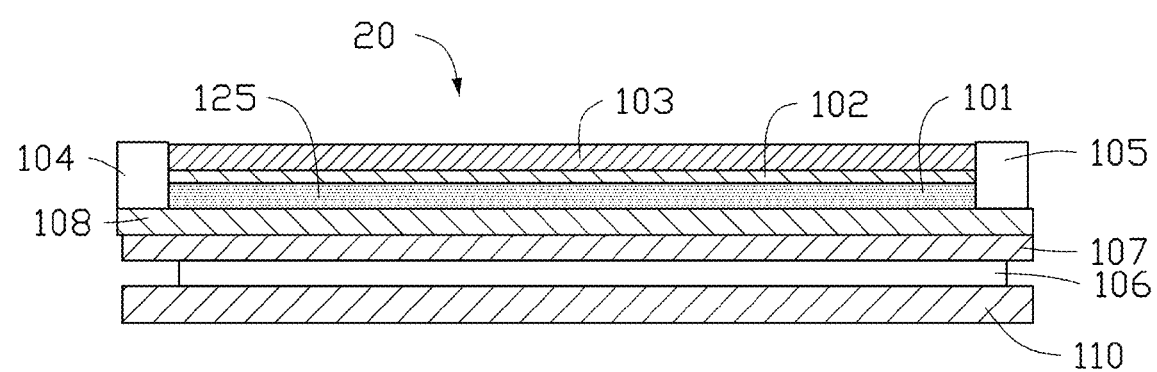
FIG. 9 shows a cross-section view of one embodiment of an N-type TFT.

Referring to FIG. 9, an MgO layer 108 can be sandwiched between the semiconductor carbon nanotube layer 101 and the insulating layer 107. The MgO layer 108 is in direct contact with the semiconductor carbon nanotube layer 101. Furthermore, the semiconductor carbon nanotube layer 101 comprises a first surface and a second surface, the MgO layer 102 covers entire the first surface, and the MgO layer 108 covers entire the second surface. Thus the semiconductor carbon nanotube layer 101 is sandwiched and sealed between the MgO layer 102 and the MgO layer 108.

A material of the insulating layer 107 can be hard materials such as aluminum oxide, hafnium oxide, silicon nitride, or silicon oxide, the material can also be flexible material such as benzocyclobutene (BCB), acrylic resin, or polyester. A thickness of the insulating layer 107 ranges from about 0.5 nanometers to about 100 microns. In one embodiment, the material of the insulating layer 107 is aluminum oxide, and the thickness is about 40 nanometers.

Figure 10:
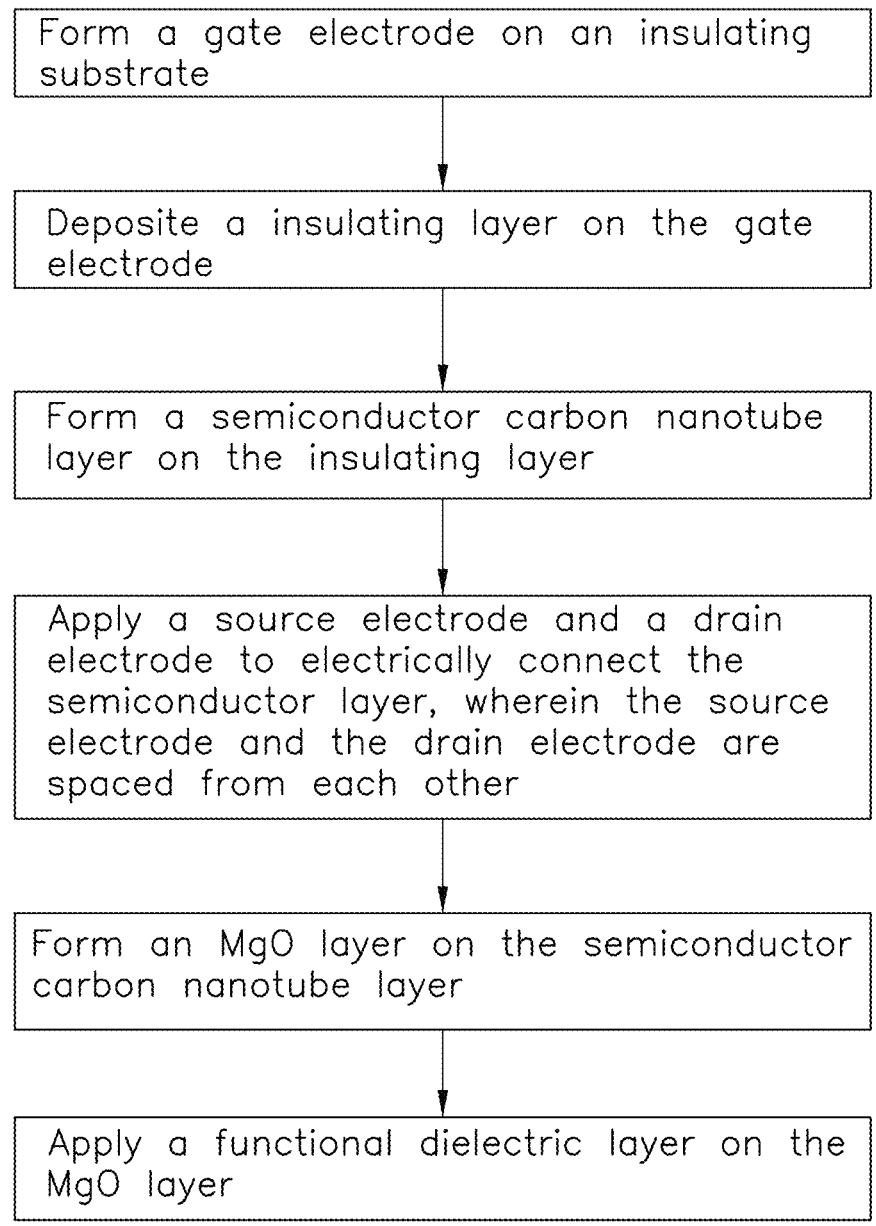
FIG. 10 is a flow chart of one embodiment of a method of making N-type ITT.

Referring to FIG. 10, one embodiment of a method of making N-type TFT 20 comprises:

step (S21), forming a gate electrode 106 on an insulating substrate 110;

step (S22), depositing a insulating layer 107 on the gate electrode 106;

step (S23), forming a semiconductor carbon nanotube layer 101 on the insulating layer 107;

step (S24), applying a source electrode 104 and a drain electrode 105 to be electrically connected to the semiconductor layer 120, wherein the source electrode 104 and the drain electrode 105 are spaced from each other;

step (S25), forming an MgO layer 102 on the semiconductor carbon nanotube layer 101; and step (S26), applying a functional dielectric layer 103 on the MgO layer 102.

The method of making N-type TFT 20 is similar to the method of making N-type TFT 10, except that the insulating layer 107 is deposited on the gate electrode 106 and the semiconductor carbon nanotube layer 101 is deposited on the insulating layer 107.

In step (S22), the insulating layer 107 can be deposited on the gate electrode 106 via magnetron sputtering, electron beam deposition, or atomic layer deposition method. In the insulating layer 107 is alumina layer deposited via atomic layer deposition method.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. An N-type thin film transistor, comprising:
   an insulating substrate;
   a semiconductor carbon nanotube layer located on the insulating substrate;
   a source electrode and a drain electrode electrically connected to the semiconductor carbon nanotube layer; wherein the source electrode and the drain electrode are spaced from each other, and a channel is defined in the semiconductor carbon nanotube layer between the source electrode and the drain electrode;
   an MgO layer on the semiconductor carbon nanotube layer;
   a functional dielectric layer covering the MgO layer; and
   a gate electrode on the functional dielectric layer.

2. The N-type thin film transistor of claim 1, wherein the semiconductor carbon nanotube layer comprises a first surface and a second surface opposite to the first surface, the first surface is in contact with the insulating substrate, and the MgO layer entirely covers the second surface.

3. The N-type thin film transistor of claim 1, wherein a thickness of the MgO layer ranges from about 1 nanometer to about 15 nanometers.

4. The N-type thin film transistor of claim 1, wherein the semiconductor carbon nanotube layer comprises a plurality of carbon nanotubes.

5. The N-type thin film transistor of claim 1, wherein the semiconductor carbon nanotube layer comprises a plurality of semi-conductive carbon nanotubes connected with each other to form a conductive network.

6. The N-type thin film transistor of claim 5, wherein a percentage of the plurality of semi-conductive carbon nanotubes in the semiconductor carbon nanotube layer is greater than or equal to 66.7%.

7. The N-type thin film transistor of claim 1, wherein the semiconductor carbon nanotube layer consists of a plurality of semi-conductive carbon nanotubes.

8. The N-type thin film transistor of claim 1, wherein a thickness of the semiconductor carbon nanotube layer ranges from about 0.5 nanometers to about 2 nanometers.

9. The N-type thin film transistor of claim 1, wherein the MgO layer is in direct contact with the semiconductor carbon nanotube layer.

10. The N-type thin film transistor of claim 1, wherein a thickness of the MgO layer ranges from about 1 nanometer to about 15 nanometers.

11. The N-type thin film transistor of claim 1, wherein the functional dielectric layer is in direct contact with the MgO layer and entirely covers the MgO layer.

12. The N-type thin film transistor of claim 1, wherein a material of the functional dielectric layer is selected from the group consisting of aluminum oxide, hafnium oxide, and yttrium oxide.

13. The N-type thin film transistor of claim 1, wherein a thickness of the functional dielectric layer ranges from about 20 nanometers to about 40 nanometers.

14. The N-type thin film transistor of claim 1, wherein the semiconductor carbon nanotube layer is a free-standing structure.

* * * * *